(12) United States Patent
Wendt et al.

(10) Patent No.: US 9,181,620 B2
(45) Date of Patent: Nov. 10, 2015

(54) COATINGS FOR CUTTING TOOLS

(71) Applicant: Kennametal Inc., Latrobe, PA (US)

(72) Inventors: Karl Heinz Wendt, Ebermannstadt (DE); Volkmar Sottke, Mulheim (DE); Peter Rudolf Leicht, Latrobe, PA (US); Yixiong Liu, Greensburg, PA (US); Mark S. Greenfield, Greensburg, PA (US); Hartmut Westphal, Dermbach (DE)

(73) Assignee: KENNAMETAL INC., Latrobe, PA (US)

( * ) Notice: Subject to any disclaimer, the term of this patent is extended or adjusted under 35 U.S.C. 154(b) by 0 days.

(21) Appl. No.: 14/221,138

(22) Filed: Mar. 20, 2014

(65) Prior Publication Data
US 2014/0287229 A1 Sep. 25, 2014

Related U.S. Application Data

(60) Provisional application No. 61/804,077, filed on Mar. 21, 2013.

(51) Int. Cl.
*C23C 16/06* (2006.01)
*C23C 16/40* (2006.01)
*C23C 16/455* (2006.01)
*C23C 30/00* (2006.01)

(52) U.S. Cl.
CPC ............ *C23C 16/40* (2013.01); *C23C 16/45523* (2013.01); *C23C 30/005* (2013.01); *Y10T 428/265* (2015.01)

(58) Field of Classification Search
USPC ............ 51/307, 309; 428/325, 697, 698, 699, 428/701, 702
See application file for complete search history.

(56) References Cited

U.S. PATENT DOCUMENTS

| | | | |
|---|---|---|---|
| 4,052,530 | A | 10/1977 | Fonzi |
| 4,112,148 | A | 9/1978 | Fonzi |
| 4,180,400 | A | 12/1979 | Smith et al. |
| 4,576,836 | A | 3/1986 | Colmet et al. |
| 4,701,384 | A | 10/1987 | Sarin et al. |
| 4,702,970 | A | 10/1987 | Sarin et al. |

(Continued)

FOREIGN PATENT DOCUMENTS

| | | |
|---|---|---|
| CN | 102581324 A | 7/2012 |
| DE | 2736982 A1 | 3/1979 |

(Continued)

OTHER PUBLICATIONS

Martensson "Influence of the concetnration of ZrCl4 on the texture, morphology and growth rate of CVD grown alpha-Al2O3 coatings deposited by AlCl3/Zrcl4/H2/Co2/H2S process" Surface & technology 200 (2006) p. 3626-3632.*

(Continued)

*Primary Examiner* — Archene Turner
(74) *Attorney, Agent, or Firm* — Matthew W. Gordon

(57) ABSTRACT

In one aspect, cutting tools are described having coatings adhered thereto which, in some embodiments, can demonstrate desirable wear resistance and increased cutting lifetimes. A coated cutting tool, in some embodiments, comprises a substrate and a coating adhered to the substrate, the coating comprising at least one Zr doped layer deposited by chemical vapor deposition comprising $ZrAl_2O_3$.

34 Claims, 4 Drawing Sheets

(56) References Cited

U.S. PATENT DOCUMENTS

| | | | |
|---|---|---|---|
| 4,745,010 A | 5/1988 | Sarin et al. | |
| 4,746,563 A | 5/1988 | Nakano et al. | |
| 4,749,629 A | 6/1988 | Sarin et al. | |
| 4,751,109 A | 6/1988 | Sarin et al. | |
| 4,844,951 A | 7/1989 | Sarin et al. | |
| 5,310,607 A | 5/1994 | Schulz et al. | |
| 5,447,804 A | 9/1995 | Schulz et al. | |
| 5,709,907 A | 1/1998 | Battaglia et al. | |
| 5,722,803 A | 3/1998 | Battaglia et al. | |
| 5,770,261 A | 6/1998 | Nakamura et al. | |
| 5,827,570 A | 10/1998 | Russell | |
| 5,861,210 A * | 1/1999 | Lenander et al. | 51/307 |
| 5,871,850 A | 2/1999 | Moriguchi et al. | |
| 5,879,823 A | 3/1999 | Prizzi et al. | |
| 5,972,495 A | 10/1999 | Ishii et al. | |
| 5,985,427 A | 11/1999 | Ueda et al. | |
| 6,156,383 A | 12/2000 | Ishii et al. | |
| 6,161,990 A | 12/2000 | Oles et al. | |
| 6,183,846 B1 | 2/2001 | Moriguchi et al. | |
| 6,333,103 B1 | 12/2001 | Ishii et al. | |
| 6,426,137 B1 | 7/2002 | Oshika et al. | |
| 6,436,519 B2 | 8/2002 | Holzschuh | |
| 6,599,062 B1 | 7/2003 | Oles et al. | |
| 6,641,939 B1 | 11/2003 | Lee et al. | |
| 6,660,371 B1 | 12/2003 | Westphal et al. | |
| 6,689,422 B1 | 2/2004 | Warnes et al. | |
| 6,713,172 B2 | 3/2004 | Ljungberg et al. | |
| 6,726,987 B2 | 4/2004 | Kathrein et al. | |
| 6,756,111 B1 | 6/2004 | Okada et al. | |
| 6,849,132 B2 | 2/2005 | Warnes et al. | |
| 6,869,668 B2 | 3/2005 | Martensson | |
| 6,902,764 B2 | 6/2005 | Ljungberg et al. | |
| 7,011,867 B2 | 3/2006 | Martensson | |
| 7,090,914 B2 | 8/2006 | Yamagata et al. | |
| 7,094,447 B2 | 8/2006 | Ruppi | |
| 7,163,735 B2 | 1/2007 | Ruppi | |
| 7,241,492 B2 | 7/2007 | Kohara et al. | |
| 7,273,665 B2 | 9/2007 | Hayahi et al. | |
| 7,276,301 B2 | 10/2007 | Tsushima et al. | |
| 7,326,461 B2 | 2/2008 | Sottke et al. | |
| 7,378,158 B2 | 5/2008 | Richter et al. | |
| 7,396,581 B2 | 7/2008 | Ruppi | |
| 7,410,707 B2 | 8/2008 | Fukui et al. | |
| 7,416,778 B2 | 8/2008 | Westergren et al. | |
| 7,442,433 B2 | 10/2008 | Honma et al. | |
| 7,498,089 B2 | 3/2009 | Omori et al. | |
| 7,531,212 B2 | 5/2009 | Kohara et al. | |
| 7,531,213 B2 | 5/2009 | Bjormander | |
| 7,597,511 B2 | 10/2009 | Tomita et al. | |
| 7,597,951 B2 | 10/2009 | Bjormander et al. | |
| 7,597,970 B2 | 10/2009 | Fukano et al. | |
| 7,691,496 B2 | 4/2010 | Park et al. | |
| 7,803,464 B2 | 9/2010 | Okada et al. | |
| 7,820,310 B2 | 10/2010 | Bjormander | |
| 7,901,788 B2 | 3/2011 | Warnes et al. | |
| 7,906,230 B2 | 3/2011 | Watanabe et al. | |
| 7,923,101 B2 | 4/2011 | Ruppi | |
| 7,928,028 B2 | 4/2011 | Nawa et al. | |
| 7,939,181 B2 | 5/2011 | Ramm et al. | |
| 7,967,533 B2 | 6/2011 | Omori et al. | |
| 7,968,182 B2 | 6/2011 | Trinh et al. | |
| 7,972,714 B2 | 7/2011 | Okada et al. | |
| 8,003,234 B2 * | 8/2011 | Omori et al. | 428/701 |
| 8,012,611 B2 | 9/2011 | Okada et al. | |
| 8,025,991 B2 | 9/2011 | Schier | |
| 8,071,211 B2 | 12/2011 | Koike et al. | |
| 8,080,312 B2 | 12/2011 | McNerny et al. | |
| 8,080,323 B2 * | 12/2011 | Ban et al. | 428/702 |
| 8,097,332 B2 | 1/2012 | Omori et al. | |
| 8,119,226 B2 | 2/2012 | Reineck et al. | |
| 8,119,227 B2 * | 2/2012 | Reineck et al. | 428/325 |
| 8,129,040 B2 | 3/2012 | Quinto et al. | |
| 8,152,971 B2 | 4/2012 | Quinto et al. | |
| 8,221,838 B2 | 7/2012 | Gates, Jr. et al. | |
| 8,288,019 B2 | 10/2012 | Nagano et al. | |
| 2001/0006724 A1 | 7/2001 | Holzschuh | |
| 2002/0081447 A1 | 6/2002 | Movchan et al. | |
| 2002/0114945 A1 | 8/2002 | Greenberg et al. | |
| 2002/0119017 A1 | 8/2002 | Gates, Jr. et al. | |
| 2004/0224159 A1 | 11/2004 | Oshika et al. | |
| 2004/0241490 A1 | 12/2004 | Finley | |
| 2005/0260454 A1 | 11/2005 | Fang et al. | |
| 2006/0029813 A1 | 2/2006 | Kutilek et al. | |
| 2006/0292390 A1 | 12/2006 | Kassner et al. | |
| 2007/0212895 A1 | 9/2007 | Chua et al. | |
| 2007/0289280 A1 | 12/2007 | Marquardt | |
| 2008/0196318 A1 | 8/2008 | Bost et al. | |
| 2010/0166512 A1 | 7/2010 | Tanibuchi | |
| 2010/0303566 A1 | 12/2010 | Fang et al. | |
| 2012/0003452 A1 | 1/2012 | Tomita et al. | |

FOREIGN PATENT DOCUMENTS

| | | |
|---|---|---|
| EP | 0786536 B1 | 5/2003 |
| EP | 1655387 B1 | 5/2008 |
| JP | 56152962 A | 11/1981 |
| JP | 57158372 A | 9/1982 |
| JP | 5921586 A | 2/1984 |
| JP | 5985860 A | 5/1984 |
| JP | 0516031 A | 1/1993 |
| JP | 4195518 B2 | 7/1998 |
| JP | 4019244 B2 | 6/2002 |
| JP | 2003039207 A | 2/2003 |
| JP | 2005205516 A | 8/2005 |
| JP | 2006219739 A | 8/2006 |
| JP | 4645983 B2 | 10/2006 |
| JP | 2006289556 A | 10/2006 |
| JP | 2008019489 A | 1/2008 |
| JP | 2008019498 A | 1/2008 |
| JP | 4822120 B2 | 2/2008 |
| JP | 5019255 B2 | 1/2009 |
| JP | 5099490 B2 | 4/2009 |
| JP | 5099500 B2 | 7/2009 |
| JP | 2011057529 A | 3/2011 |
| JP | 2011127165 A | 6/2011 |
| JP | 2011184295 A | 9/2011 |
| JP | 2012143825 A | 8/2012 |
| KR | 1020060102658 A | 9/2006 |
| WO | 02/077312 A2 | 10/2002 |

OTHER PUBLICATIONS

X. Feng et al., "Converting Ceria Polyhedral Nanoparticles into Single-Crystal Nanospheres", Science Magazine, vol. 312, Jun. 9, 2006, pp. 1504-1508.

Z. Yu et al., "Atomic-resolution observation of Hf-doped alumina grain boundaries", SciVerse ScienceDirect, Scripta Materialia 68 (2013) pp. 703-706.

N. Shibata et al., "Atomic-scale imaging of individual dopant atoms in a buried interface", Nature Materials, vol. 8, 2009, pp. 654-658.

J. P. Buban et al., "Grain Boundary Strengthening in Alumina by Rare Earth Impurities", Science Magazine, vol. 311, Jan. 13, 2006, pp. 212-215.

Z. Li et al., "Nanodomain formation and distribution in Gd-doped ceria", SciVerse ScienceDirect, Materials Research Bulletin 47 (2012) pp. 763-767.

C. Bjormander, "CVD deposition and characterization of coloured Al2O3/ZrO2 multilayers", ScienceDirect, Surface & Coatings Technology 201 (2006) pp. 4032-4036.

D. Hochauer et al., "Titanium doped CVD alumina coatings", ScienceDirect, Surface & Coatings Technology 203 (2008) pp. 350-356.

W. C. Russell et al., "Wear Characteristics and Performance of Composite Alumina-Zirconia CVD Coatings*", Int. J. of Refractory Metals & Hard Materials 14 (1996) pp. 51-58.

S. Taylor, "Grain Boundary Structure and Solute Segregation in Titanium-Doped Sapphire Bicrystals", Disseeration, University of California, Berkley, Spring 2002, pp. 1-222.

Jul. 7, 2014—PCT_Search_Report_and_Written_Opinion.

Kathrein et al., "Doped CVD Al2O3 Coatings for High Performance Cutting Tools", Surface & Coatings Technology 163-164 (2001), pp. 181-188.

(56) References Cited

OTHER PUBLICATIONS

Moltrecht, "Machine Shop Practice", Industrial Press Inc., New York, New York (1981), pp. 199-204.
ASTE Tool Engineers Handbook; McGraw Hill Book Co., New York, New York (1949), pp. 302-315.
International Search Report for PCT Application No. PCT/US2014/031358, mailed Jul. 7, 2014, 1 page.
International Search Report for PCT Application No. PCT/US2014/031291, mailed Jul. 4, 2014, 1 page.

* cited by examiner

COATINGS FOR CUTTING TOOLS

RELATED APPLICATION DATA

The present application claims priority pursuant to 35 U.S.C. §119(e) to U.S. Provisional Patent Application Ser. No. 61/804,077 filed Mar. 21, 2013, which is hereby incorporated by reference in its entirety.

FIELD

The present invention relates to coatings for cutting tools.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by chemical vapor deposition (CVD) and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

In an effort to increase performance, some have tried to modify $Al_2O_3$. DE2736982 to Hillnhagen describes a ceramic matrix (e.g. alumina), into which a further material (e.g. ZrO2) is stored and the stored material has clearly distinct coefficients of thermal expansion producing a coating with very fine micro-cracks.

U.S. Pat. No. 4,702,970 to Sarin et al. and U.S. Pat. No. 4,749,629 to Sarin et al. describe a hard ceramic substrate coated with a ceramic coating having at least two phases. The first phase is a continuous oxide matrix layer of alumina, zirconia, or yttria. At least one discontinuous second or additional phase of oxides of aluminum, zirconium, or yttrium, or solid solutions thereof, is dispersed as discrete particles within the matrix layer. The additional phase material is different from the matrix material.

In Russell, W. C., Strandberg, C., "Wear Characteristics and Performance of Alumina-Zirconia CVD Coatings", *Int. J. of Refractory Metals & Hard Materials*, 14 (1996) 51-58, the authors describe using various doped amounts of $ZrO_2$ within an alumina matrix. Further, this article discloses a Ti layer adjacent the substrate followed by a pure alumina layer for adhesion followed by an $Al_2O_3/ZrO_2$ coating.

U.S. Pat. No. 7,276,301 to Tsushima et al. discloses an α-type $(Al,Zr)_2O_3$ layer with a $TiO_y$ upper layer. The $(Al,Zr)_2O_3$ is deposited having a β-type crystal structure. Post coat heat treatment is described as a method of converting the $(Al,Zr)_2O_3$ an α-type crystal structure.

U.S. Pat. No. 7,597,511 to Tomita et al. discloses an aluminum oxide layer with α-type crystal structure and containing Zr. The Zr containing coating is claimed to have a particular crystallographic orientation where a defined Σ3 value is greater than 60%.

DETAILED DESCRIPTION

Figure 1:
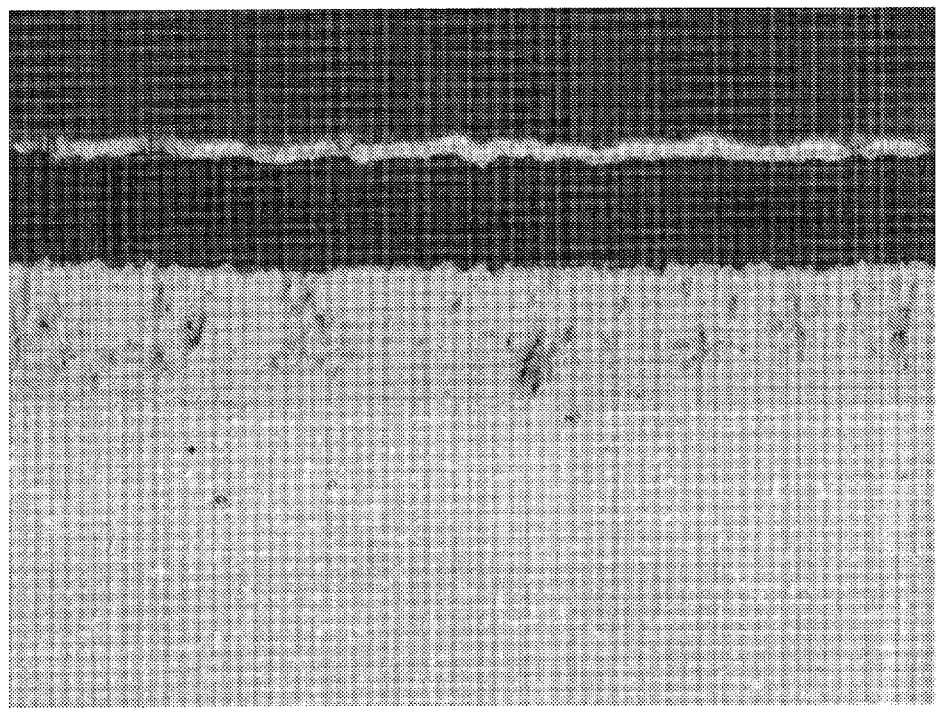
FIG. 1 is a photomicrograph of a section of a coated cutting insert demonstrating layers of the coating architecture according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, cutting tools are described having coatings adhered thereto which, in some embodiments, can demonstrate desirable wear resistance and increased cutting lifetimes. A coated cutting tool, in some embodiments, comprises a substrate and a coating adhered to the substrate, the coating comprising at least one Zr doped layer deposited by chemical vapor deposition comprising $ZrAl_2O_3$. In some embodiments, zirconium is present in a polycrystalline $ZrAl_2O_3$ layer in an amount selected from Table XI.

TABLE XI

| Zr of Polycrystalline $ZrAl_2O_3$ Layer Zr Content (wt. %) |
| --- |
| 0.01-5 |
| 0.1-4 |
| 0.15-3 |
| 0.2-2 |

In being a dopant, zirconium can be incorporated into the lattice of an $Al_2O_3$ phase. In such embodiments, zirconium does not form oxide phase(s) separate from the $Al_2O_3$ phase.

Turning now to specific components, a coated cutting tool described herein comprises a substrate. Substrates of coated cutting tools can comprise any material not inconsistent with the objectives of the present invention. In some embodiments, a substrate comprises cemented carbide, carbide, ceramic, cermet, steel, PCD, PcBN or a combination of those listed.

A cemented carbide substrate, in some embodiments, comprises tungsten carbide (WC). WC can be present in a substrate in an amount of at least about 70 weight percent. In some embodiments, WC is present in a substrate in an amount of at least about 80 weight percent or in an amount of at least about 85 weight percent. Additionally, metallic binder of a cemented carbide substrate can comprise cobalt or cobalt alloy. Cobalt, for example, can be present in a cemented carbide substrate in an amount ranging from about 3 weight percent to about 15 weight percent. In some embodiments, cobalt is present in a cemented carbide substrate in an amount ranging from about 5 weight percent to about 12 weight percent or from about 6 weight percent to about 10 weight percent. Further, a cemented carbide substrate may exhibit a zone of binder enrichment beginning at and extending inwardly from the surface of the substrate.

A cemented carbide substrate can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with the WC in the substrate. The substrate, in some embodiments, comprises one or more solid solution carbides in an amount ranging from about 0.1 weight percent to about 5 weight percent. Additionally, a cemented carbide substrate can comprise nitrogen.

In some embodiments, a substrate of a coated cutting tool described herein comprises one or more cutting edges formed at the juncture of a rake face and flank faces of the substrate. In other embodiments, a substrate of a coated cutting tool is an insert, drill bit, saw blade or other cutting apparatus.

Figure 2:
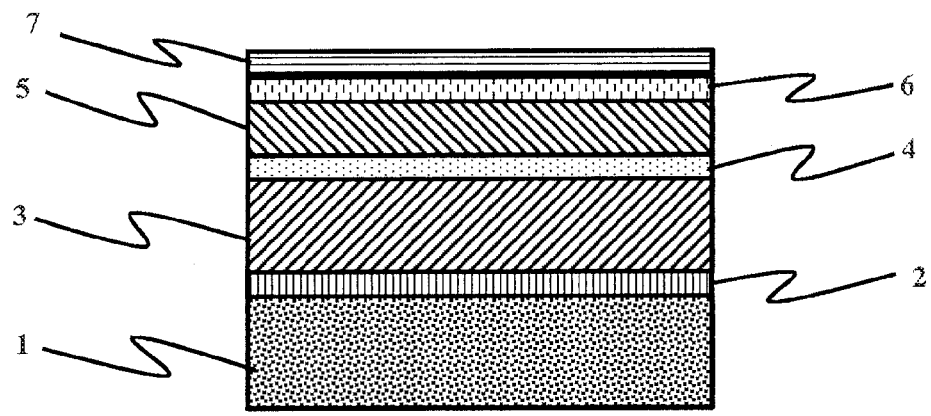
FIG. 2 illustrates a substrate of a coated cutting tool according to one embodiment described herein.

FIG. 1 is photomicrograph of a section of a coated cutting insert demonstrating layers of the coating architecture according to one embodiment described herein. FIG. 2 illustrates a coated cutting insert according to the embodiment shown in FIG. 1. The cutting insert of FIGS. 1 and 2 comprises a substrate 1 of cemented WC. The substrate 1 is coated with multilayer coating. Beginning from the substrate and progressing outward the coating comprises an inner layer 2 of TiN, a MT TiCN layer 3, a TiCN layer 4, a $ZrAl_2O_3$ layer 5, a penultimate TiCN layer 6 and an outer TiN layer 7.

Figure 3:
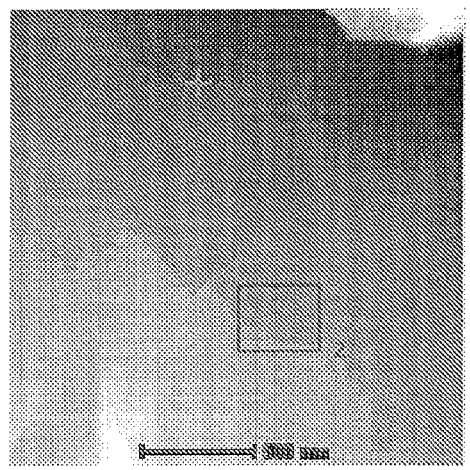
FIG. 3 is an a high angle annual dark field image of a section of $ZrAl_2O_3$ produced by a scanning transmission microscopy, hereinafter STEM HAADF. The selected areas differed by composition via x-ray energy dispersive spectrum analysis according to one embodiment described herein.
Figure 4:
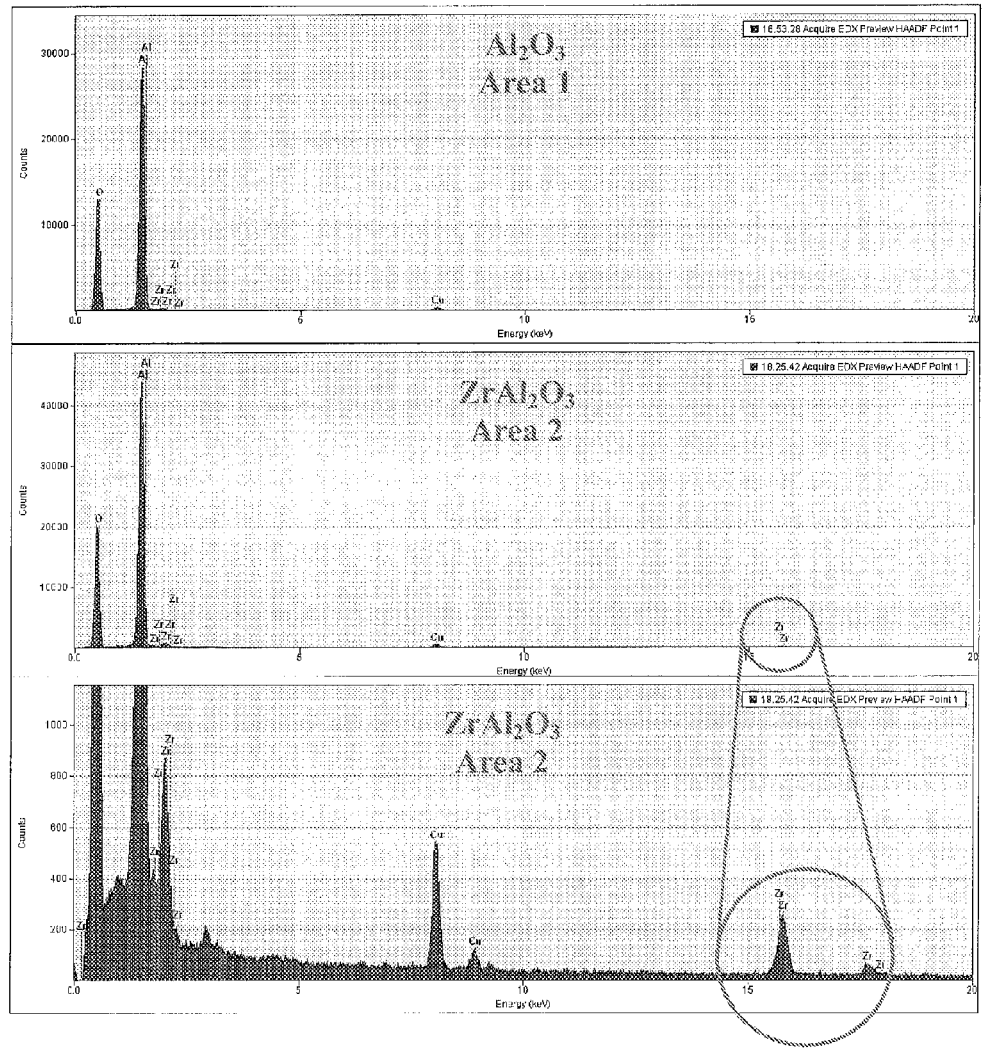
FIG. 4 illustrates Energy Dispersive X-ray (EDS) spectrographs of the area 1 and area 2 from the image of FIG. 3.

FIG. 3 is a HAADF image of a section of a $ZrAl_2O_3$ produced by STEM. The selected areas differed by composition via x-ray energy dispersive spectrum analysis according to one embodiment described herein. Area 1 of FIG. 3 highlights a section of a single grain of the $ZrAl_2O_3$ coating in which no Zr is present. Area 2 highlights a second area of the same grain in which Zr can be detected. FIG. 4 illustrates Energy Dispersive X-ray (EDS) spectrographs of the Area 1 and Area 2 from FIG. 3. The EDS confirm the presence of Zr in Area 2 and absence of Zr in Area 1. This variable doping has shown be advantageous in certain metalcutting conditions.

Figure 5:
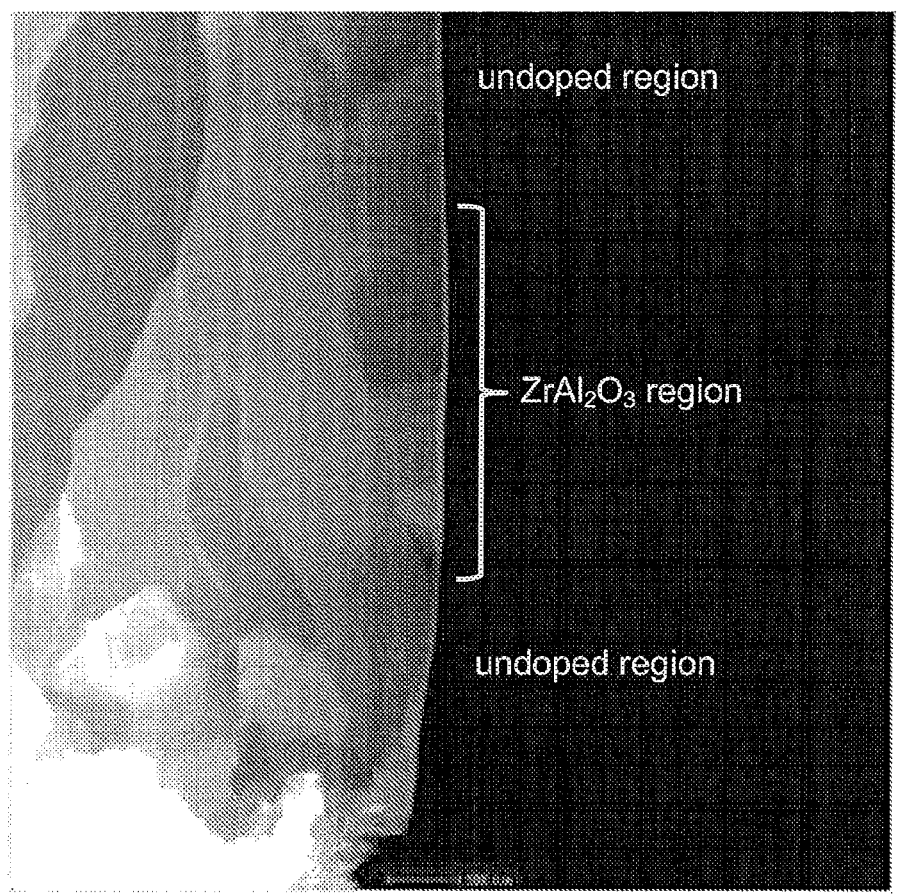
FIG. 5 is an optical image of section of $ZrAl_2O_3$ produced according to one embodiment described herein.

FIG. 5 is an optical image of section of $ZrAl_2O_3$ produced according to one embodiment described herein. In FIG. 5 a $ZrAl_2O_3$ coating is shown. Doped and undoped regions of the coating are indicated.

Further, a polycrystalline $ZrAl_2O_3$ layer of a coating described herein can have any thickness not inconsistent with the objectives of the present invention. In some embodiments, a $ZrAl_2O_3$ layer has a thickness selected from Table XII.

TABLE XII

| $ZrAl_2O_3$ Layer Thickness (μm) |
| $ZrAl_2O_3$ Layer Thickness (μm) |
| --- |
| 0.5-15 |
| 1-12 |
| 1.5-10 |
| 2.5-8 |

A $ZrAl_2O_3$ layer can be deposited directly on the cutting tool substrate surface. Alternatively, a coating described herein can further comprise one or more inner layers between the $ZrAl_2O_3$ layer and the substrate. One or more inner layers, in some embodiments, comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more inner layers between the substrate and $ZrAl_2O_3$ layer comprise a carbide, nitride, carbonitride, oxide or boride of one or more metallic elements selected from the group consisting of aluminum and metallic elements of Groups IVB, VB and VIB of the Periodic Table. For example, one or more inner layers are selected from the group consisting of titanium nitride, titanium carbonitride, titanium carbide, titanium oxide, zirconium oxide, zirconium nitride, zirconium carbonitride, hafnium nitride, hafnium carbonitride and alumina and mixtures thereof.

Inner layers of coatings described herein can have any thickness not inconsistent with the objectives of the present invention. An inner layer of a coating can have a thickness ranging from 0.5 μm to 25 μm. In some embodiments, thickness of an inner layer is selected according to the position of the inner layer in the coating. An inner layer deposited directly on a surface of the substrate as an initial layer of the coating, for example, can have a thickness ranging from 0.5 to 2.5 μm. An inner layer deposited over the initial layer, such as a TiCN layer, can have a thickness ranging from 2 μm to 20 μm. Further, an inner layer on which a $ZrAl_2O_3$ layer described herein is deposited, such as a layer comprising alumina, can have a thickness ranging from 1 to 6 μm.

In some embodiments, a $ZrAl_2O_3$ layer described herein is the outermost layer of the coating. Alternatively, a coating described herein can comprise one or more outer layers over the $ZrAl_2O_3$ layer. One or more outer layers, in some embodiments, comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers over the $ZrAl_2O_3$ layer comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium carbide, zirconium nitride, zirconium carbonitride, hafnium nitride, hafnium carbonitride, titanium oxycarbonitride, zirconium oxycarbonitride, hafnium oxycarbonitride and alumina and mixtures thereof.

Outer layers of coatings described herein can have any thickness not inconsistent with the objectives of the present invention. An outer layer of a coating, in some embodiments, can have a thickness ranging from 0.5 μm to 5 μm.

Additionally, in some embodiments, a coating described herein can comprise one or more bonding layers. A bonding layer can demonstrate various positions in the coating. In some embodiments, a bonding layer is disposed between two inner layers of the coating, such as between a titanium nitride or titanium carbonitride inner layer and an inner layer comprising alumina. A bonding layer can also be disposed between an inner layer and a $ZrAl_2O_3$ layer described herein. Further, a bonding layer can be disposed between a $ZrAl_2O_3$ layer and an outer layer of the coating. In some embodiments, bonding layers are used to increase adhesion between layers of the coating and/or nucleate the desired morphology of a coating layer deposited on the bonding layer. A bonding layer, in some embodiments, is of the formula $M(O_xC_yN_z)$, wherein M is a metal selected from the group consisting of metallic elements of Groups IVB, VB and VIB of the Periodic Table and $x≥0$, $y≥0$ and $z≥0$ wherein $x+y+z=1$. For example, in one embodiment, a bonding layer of TiC is employed between an inner layer of TiCN and an inner layer comprising alumina.

A bonding layer of the formula $M(O_xC_yN_z)$ can have any thickness not inconsistent with the objectives of the present invention. In some embodiments, a $M(O_xC_yN_z)$ layer has a thickness of about 0.5 μm. Moreover, a $M(O_xC_yN_z)$ layer can have a thickness ranging from 0.5 μm to 5 μm.

A coating adhered to a substrate can have any architecture of $ZrAl_2O_3$ layer, inner layer(s) and/or outer layer(s) described herein. In some embodiments, a coating described herein has an architecture selected from Table VII.

In some embodiments, a coating described herein has a nanoindentation hardness of 2866. The load is about 80 mN with penetration depth of 0.20 μm in 15 s. The hardness is 2866 for certain embodiments described herein.

Additionally, a coating described herein can demonstrate a critical load ($L_c$) up to about 90 N. $L_c$ values for coatings described herein were determined according to ASTM C1624-05—Standard Test for Adhesion Strength by Quantitative Single Point Scratch Testing wherein a progressive loading of 10 N was used. A coating, for example, can exhibit a $L_c$ value of 60 to 90 N.

In some embodiments the coatings may be post coat blasted. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting.

In one embodiment, for example, post coat treatment of a coating described herein can be administered by dry blasting the coating with alumina and/or ceramic particles. Alternatively, the coating can be wet blasted using a slurry of alumina and/or ceramic particles in water at a concentration of 5 volume percent to 35 volume percent. Alumina and/or ceramic particles of post-coat blasting techniques described herein can have a size distribution of 60 μm to 120 μm.

Additionally, blasting pressures can range from 2 bar to 3 bar for a time period of 1 to 15 seconds, wherein the blast nozzle is 2 to 8 inches from the coating surface being blasted. Further, angle of impingement of the alumina and/or ceramic particles can be chosen to range from 45 degrees to 90 degrees.

In another aspect, methods of making coated cutting tools are described herein. A method of making a coated cutting tool, in some embodiments, comprises providing a substrate and depositing over the substrate by chemical vapor deposition at least one $ZrAl_2O_3$ layer of a coating, the $ZrAl_2O_3$ layer comprising at least one Zr doped region and one undoped region.

Turning now to specific steps, a method described herein comprises providing a substrate. A substrate can comprise any substrate recited in Section I hereinabove. In some embodiments, for example, a substrate is cemented carbide, such as cemented tungsten carbide described in Section I herein. Moreover, a polycrystalline $ZrAl_2O_3$ layer deposited according to methods described herein can have any construction, compositional parameters and/or properties described in Section I herein for a $ZrAl_2O_3$ layer.

In a method described herein, a $ZrAl_2O_3$ layer can be deposited from a gaseous mixture comprising an aluminum source, oxygen source, nitrogen source and source for the zirconium. In some embodiments, for example, the aluminum source is $AlCl_3$, and the zirconium source is a $ZrCl_4$. In one embodiment a $ZrAl_2O_3$ layer is made by alternating Cycle A and Cycle B according to the CVD processing parameters of Table I.

TABLE I

|  | Cycle A | Cycle B | Cycle A |
|---|---|---|---|
| Temp. (° C.) | 950-1010 | 950-1010 | 950-1010 |
| Press. (mbar) | 60-80 | 60-80 | 60-80 |
| Time (min.) | 20-90 | 20-90 | 20-90 |
| $H_2$ | balance | balance | balance |
| $AlCl_3$ | 1.5-3 vol. % | 1.5-3 vol. % | 1.5-3 vol. % |
| $ZrCl_4$ | — | 0.2-1 vol. % | — |
| $CO_2$ | 3-6 vol. % | 3-6 vol. % | 3-6 vol. % |
| HCl | 1-3 vol. % | 1-3 vol. % | 1-3 vol. % |
| $H_2S$ | 0.15-0.6 vol. % | 0.15-0.6 vol. % | 0.15-0.6 vol. % |
| Ar | — | 1-2% | — |

In another embodiment a $ZrAl_2O_3$ coating is made according to the CVD processing parameters provided in Table II. The embodiment described in Table II provides a Zr doping gradient in the Zr doped section of the $ZrAl_2O_3$ coating. Cycles C-I may be shorten and repeated to induce alternating intragranular doped and undoped regions.

TABLE II

|  | Cycle C | Cycle D | Cycle E | Cycle F | Cycle G | Cycle H | Cycle I |
|---|---|---|---|---|---|---|---|
| Temp. (° C.) | 950-1010 | 950-1010 | 950-1010 | 950-1010 | 950-1010 | 950-1010 | 950-1010 |
| Press. (mbar) | 60-80 | 60-80 | 60-80 | 60-80 | 60-80 | 60-80 | 60-80 |
| Time (min.) | 20-90 |  |  | 20-90 |  |  | 20-90 |
| $H_2$ | balance | balance | balance | balance | balance | balance | balance |
| $AlCl_3$ (vol. %) | 1.5-3 | 1.5-3 | 1.5-3 | 1.5-3 | 1.5-3 | 1.5-3 | 1.5-3 |
| $ZrCl_4$ (vol. %) | — | 0.10-0.15 | 0.18-0.21 | 0.24-0.26 | 0.18-0.21 | 0.10-0.15 | — |
| $CO_2$ (vol. %) | 3-6 | 3-6 | 3-6 | 3-6 | 3-6 | 3-6 | 3-6 |
| HCl (vol. %) | 1-3 | 1-3 | 1-3 | 1-3 | 1-3 | 1-3 | 1-3 |
| $H_2S$ (vol. %) | 0.15-0.6 | 0.15-0.6 | 0.15-0.6 | 0.15-0.6 | 0.15-0.6 | 0.15-0.6 | 0.15-0.6 |
| Ar (vol %) | — | 1-2 | 1-2 | 1-2 | 1-2 | 1-2 | — |

In another embodiment a $ZrAl_2O_3$ coating is made according to the CVD processing parameters provided in Table III. The embodiment described in Table III provides a Zr doping gradient in the Zr doped section of the $ZrAl_2O_3$ coating. Cycles J-P may be shortened and repeated to induce alternating intragranular doped and undoped regions.

TABLE III

| | Cycle J | Cycle K | Cycle L | Cycle M | Cycle N | Cycle O | Cycle P |
|---|---|---|---|---|---|---|---|
| Temp. (° C.) | 990-1000 | 990 | 990 | 990 | 990 | 990 | 990-1000 |
| Press. (mbar) | 75 | 75 | 75 | 75 | 75 | 75 | 75 |
| Time (min.) | 20-90 | | | 20-90 | | | 20-90 |
| $H_2$ | balance | balance | balance | balance | balance | balance | balance |
| $AlCl_3$ (vol. %) | 1.96 | 1.84 | 1.84 | 1.83 | 1.84 | 1.84 | 1.96 |
| $ZrCl_4$ (vol. %) | — | 0.4 | 0.61 | 0.80 | 0.61 | 0.4 | — |
| $CO_2$ (vol. %) | 3.44 | 4.2 | 4.19 | 4.18 | 4.19 | 4.2 | 3.44 |
| HCl (vol. %) | 1.38 | 1.29 | 1.29 | 1.29 | 1.29 | 1.29 | 1.38 |
| $H_2S$ (vol. %) | 0.26 | 0.24 | 0.24 | 0.24 | 0.24 | 0.24 | 0.26 |
| Ar (vol %) | — | 4.84 | 4.83 | 4.82 | 4.83 | 4.84 | — |

In another embodiment a $ZrAl_2O_3$ coating is made according to the CVD processing parameters provided in Table IV. The embodiment described in Table IV provides a Zr doping gradient in the Zr doped section of the $ZrAl_2O_3$ coating. Cycles Q-S may be shortened and repeated to induce alternating intragranular doped and undoped regions.

TABLE IV

| | Cycle Q | Cycle R | Cycle S |
|---|---|---|---|
| Temp. (° C.) | 990-1000 | 990 | 990-1000 |
| Press. (mbar) | 75 | 75 | 75 |
| Time (min.) | 20-90 | 20-90 | 20-90 |
| $H_2$ | balance | balance | balance |
| $AlCl_3$ (vol. %) | 1.96 | 1.65 | 1.96 |
| $ZrCl_4$ (vol. %) | — | 0.72 | — |
| $CO_2$ (vol. %) | 3.44 | 3.76 | 3.44 |
| HCl (vol. %) | 1.38 | 1.16 | 1.38 |
| $H_2S$ (vol. %) | 0.26 | 0.22 | 0.26 |
| Ar (vol %) | — | 14.45 | — |

In another embodiment a $ZrAl_2O_3$ coating is made according to the CVD processing parameters provided in Table V. The embodiment described in Table V provides a Zr doping gradient in the Zr doped section of the $ZrAl_2O_3$ coating. Cycles T-V may be shortened and repeated to induce alternating intragranular doped and undoped regions.

TABLE V

| | Cycle T | Cycle U | Cycle V |
|---|---|---|---|
| Temp. (° C.) | 990-1000 | 990 | 990-1000 |
| Press. (mbar) | 75 | 75 | 75 |
| Time (min.) | 20-90 | 20-90 | 20-90 |
| $H_2$ | balance | balance | balance |
| $AlCl_3$ (vol. %) | 1.96 | 1.44 | 1.96 |
| $ZrCl_4$ (vol. %) | — | 0.63 | — |
| $CO_2$ (vol. %) | 3.44 | 3.28 | 3.44 |
| HCl (vol. %) | 1.38 | 1.01 | 1.38 |
| $H_2S$ (vol. %) | 0.26 | 0.19 | 0.26 |
| Ar (vol %) | — | 24.26 | — |

A $ZrAl_2O_3$ layer, in some embodiments, is deposited directly on a surface of the substrate. Alternatively, a $ZrAl_2O_3$ layer is deposited on an inner layer of the coating. An inner layer of the coating can have any construction, compositional parameters and/or properties recited in Section I hereinabove for an inner layer. An inner layer can comprise one or more metallic elements selected from the group consisting of aluminum and one or more metallic elements of Groups IVB, VB, and VIB of the Periodic Table and one or more non-metallic elements selected from the group consisting of non-metallic elements of Groups IIIA, IVA, VA and VIA of the Periodic Table. In some embodiments, an inner layer is a carbide, nitride, carbonitride, oxide or boride of one or more metallic elements selected from the group consisting of aluminum and metallic elements of Groups IVB, VB and VIB of the Periodic Table. An inner layer over which a $ZrAl_2O_3$ layer is deposited, for example, can be selected from the group consisting of titanium nitride, titanium carbide, titanium carbonitride, titanium oxide, zirconium oxide, zirconium nitride, zirconium carbonitride, hafnium nitride, hafnium carbonitride and alumina and mixtures thereof. In one embodiment, for example, an inner layer comprises a mixture of alumina, zirconium oxide and titanium oxide ($Al_2O_3$/$ZrO_2$/$TiO_x$).

As with the $ZrAl_2O_3$ layer, inner layer(s) of a coating described herein can be deposited by CVD. In some embodiments, an inner layer of the coating, such as a TiCN layer, is deposited by medium-temperature (MT) CVD.

Further, methods described herein can also comprise depositing over the $ZrAl_2O_3$ layer one or more outer layers. Outer layer(s) of a coating described herein, in some embodiments, are deposited by CVD. An outer layer of the coating can have any construction, compositional parameters and/or properties recited in Section I hereinabove for an outer layer. An outer layer can comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers over the $ZrAl_2O_3$ layer comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium carbide, zirconium nitride, zirconium carbonitride, hafnium nitride, hafnium carbonitride, titanium oxycarbonitride, hafnium oxycarbonitride, zirconium oxycarbonitride and alumina and mixtures thereof.

Coatings of cutting tools described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 μm and about 100 μm.

Blasting parameters include pressure, angle of impingement, distance to the part surface and duration. In some embodiments, angle of impingement can range from about 45 degrees to about 90 degrees, i.e., the particles impinge the coating surface at an angle ranging from about 45 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness (Ra) and/or other parameters such as reducing residual tensile stress in the coating. In some embodiments, a coating subjected to post-coat treatment has a surface roughness (Ra) selected from Table VI.

TABLE VI

| Post-Coat Surface Roughness ($R_a$) Polished Coating Surface Roughness ($R_a$) - nm |
|---|
| ≤0500 |
| ≤250 |
| <200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN and/or TiCN. Alternatively, a post-coat treatment can remove or partially remove one or more outer layers, such as TiN and/or TiCN.

By alternating Zr doped and undoped regions of a ZrAl$_2$O$_3$ coating and by providing a Zr gradient in the Zr doped regions of the ZrAl$_2$O$_3$ coating, the inventors have improved the material properties and wear resistance of the ZrAl$_2$O$_3$ coatings. The ZrAl$_2$O$_3$ coatings are believed to have an increased micro-hardness due to a grain size decrease along with enhanced local boding along grain boundaries due to Zr atoms segregating to localized regions along the grain boundaries. Sequential doped and undoped regions also are believed to affect the grain growth kinetics, defect levels and interfacial structure compared to Al$_2$O$_3$ thin films.

These and other embodiments are further illustrated in the following non-limiting examples.

EXAMPLE 1

Coated Cutting Tool Body

Coated cutting tools 1 and 2 described herein were produced by placing cemented tungsten carbide (WC) cutting insert substrates [ANSI standard geometry CNMG432RN] into an axial flow hot-wall CVD reactor. The cutting inserts each comprised 7 wt. % cobalt binder with the balance WC grains of size 1 to 5 μm. A coating having an architecture provided in Table VII was deposited on the cemented WC cutting inserts according to the CVD process parameters provided in Table II. ZrCl$_4$ was presented in the CVD gas mixture in gradient steps to provide a polycrystalline ZrAl$_2$O$_3$ layer having an intra-layer compositional gradient of Al$_2$O$_3$ stages alternating with a gradient ZrAl$_2$O$_3$ stage.

TABLE VII

| CVD Coating Architecture | |
|---|---|
| Substrate | CVD Coating Architecture |
| WC—Co | TiN*—TiCN(MT)—TiCN(HT)/TiOCN—ZrAl$_2$O$_3$—TiN/TiCN |

*Innermost layer adjacent to the substrate

The multilayered coatings of cutting inserts 1 and 2 comprising the polycrystalline ZrAl$_2$O$_3$ layer exhibited the properties provided in Table VIII.

TABLE VIII

| Properties of CVD Coating | |
|---|---|
| Coating Layers | Thickness (μm) |
| TiN* | 0.3-0.7 |
| TiCN(MT) | 8.5-9 |
| TiCN(HT)/TiOCN | 0.8-1.2 |
| ZrAl$_2$O$_3$ | 6.8-7.2 |
| TiN/TiCN | 1.3-1.7 |

*Coating Layer adjacent to WC—Co Substrate

FIG. 1 is a cross-sectional SEM image of a coated cutting insert of this Example 1 demonstrating layers of the coating architecture. Further, cutting insert 1 was subjected to dry polishing with diamond paste and cutting insert 2 was subjected wet-blasting with alumina grit as a post coat treatment.

EXAMPLE 2

Metal Cutting Testing

Coated cutting inserts (1-2) of Example 1 and Comparative coating insert 3 were subjected to continuous turning testing of 1045 steel according to the parameters below. Comparative cutting insert 3 displayed a coating architecture and properties set forth in Table IX. Comparative cutting insert 3 employed a WC-Co substrate of substantially similar composition as Example 1 and an ANSI standard geometry CNMG432RN. Comparative cutting insert 3 was subjected to a wet blasting with alumina grit as a post coat treatment.

TABLE IX

| Comparative cutting insert 3 | |
|---|---|
| Coating Layers | Thickness (μm) |
| TiN* | 0.1-0.5 |
| TiCN(MT) | 7.0-9.0 |
| TiCN(HT)/TiOCN | 0.8-1.3 |
| $Al_2O_3$ | 7.1-8.5 |
| TiN/TiCN | removed |

*Coating Layer adjacent to WC—Co Substrate

Coated cutting inserts 1 and 2 of Example 1 and Comparative coating insert 3 were subjected to continuous turning testing as follows:
Workpiece—1045 Steel
Speed—1000 sfm (304.8 m/min)
Feed Rate—0.012 ipr (0.3048 mm/min)
Depth of Cut—0.08 inch (0.08 mm)
Lead Angle: −5°
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) Of 0.012 inches
Trailing Edge Wear (TW) of 0.012 inches
Two cutting inserts were tested for each coating architecture (1-3) providing repetition 1 and 2 data as well as mean cutting lifetime. The results of the continuous turning testing are provided in Table X.

TABLE X

| Continuous Turning Testing Results | | | |
|---|---|---|---|
| Cutting Insert | Repetition 1 Lifetime (minutes) | Repetition 2 Lifetime (minutes) | Mean Cutting Lifetime (minutes) |
| 1 | 21.3 | 24.5 | 22.9 |
| 2 | 23.1 | 23.1 | 23.1 |
| 3 | 20.4 | 19.9 | 20.2 |

As provided in Table X, coated cutting tools 1 and 2 demonstrated the better mean cutting lifetime. Coating cutting tools 1 and 2 demonstrated about 14.0% improvement in cutting lifetime than coated cutting tool 3.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated cutting tool comprising:
a substrate; and
a coating adhered to the substrate comprising a polycrystalline layer of $ZrAl_2O_3$, the polycrystalline $ZrAl_2O_3$ layer having an intra-layer compositional gradient formed of an $Al_2O_3$ region transitioning to a $ZrAl_2O_3$ region along thickness of the polycrystalline layer.

2. The coated cutting tool of claim 1, wherein $Al_2O_3$ regions and $ZrAl_2O_3$ regions alternate along the thickness of the polycrystalline layer.

3. The coated cutting tool of claim 1, wherein the $ZrAl_2O_3$ stage has a zirconium gradient therein.

4. The coated cutting tool of claim 1, wherein an individual grain of the polycrystalline $ZrAl_2O_3$ layer displays the compositional gradient formed of the $Al_2O_3$ region transitioning to the $ZrAl_2O_3$ region.

5. The coated cutting tool of claim 1, wherein zirconium is located in the $ZrAl_2O_3$ region adjacent to one or more grain boundaries.

6. The coated cutting tool of claim 1, wherein zirconium is present in the polycrystalline $ZrAl_2O_3$ layer in an amount 0.01-2 wt. %.

7. The coated cutting tool of claim 1, wherein the thickness of the polycrystalline $ZrAl_2O_3$ layer is 2.5 to 8 μm.

8. The coated cutting tool of claim 1, wherein the coating further comprises one or more base layers between the substrate and the $ZrAl_2O_3$ polycrystalline layer.

9. The coated cutting tool of claim 8, wherein a base layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

10. The coated cutting tool of claim 9, wherein the one or more base layers are selected from the group consisting of TiN, TiCN and TiOCN.

11. The coated cutting tool of claim 1, wherein the coating further comprises one or more outer layers over the polycrystalline $ZrAl_2O_3$ layer.

12. The coated cutting tool of claim 11, wherein an outer layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

13. The coated cutting tool of claim 11, wherein the coating is post-coat blasted with ceramic or inorganic particles.

14. The coated cutting tool of claim 11, wherein the coating is polished.

15. The coated cutting tool of claim 1, wherein the polycrystalline $ZrAl_2O_3$ layer is deposited by thermal CVD.

16. The coated cutting tool of claim 1, wherein the substrate comprises cemented tungsten carbide or polycrystalline cubic boron nitride.

17. The coated cutting tool of claim 1, wherein the substrate is an insert, drill bit or saw blade.

18. The coated cutting tool of claim 1, wherein the coating exhibits a critical load ($L_c$) of 60 to 90 N according to ASTM C1624-05—Standard Test for Adhesion by Quantitative Single Point Scratch Testing.

19. A coated cutting tool comprising:
a substrate; and
a coating adhered to the substrate, the coating comprising a polycrystalline layer of $ZrAl_2O_3$ having a zirconium gradient along one or more $ZrAl_2O_3$ grains, the gradient formed of an $Al_2O_3$ region transitioning to a $ZrAl_2O_3$ region along a vertical dimension of the one or more $ZrAl_2O_3$ grains.

20. The coated cutting tool of claim 19, wherein the $ZrAl_2O_3$ region has a zirconium gradient therein.

21. The coated cutting tool of claim 19, wherein $Al_2O_3$ regions alternate with $ZrAl_2O_3$ regions along the vertical dimension of the one or more $ZrAl_2O_3$ grains.

22. The coated cutting tool of claim 19, wherein zirconium is present in the polycrystalline $ZrAl_2O_3$ layer in an amount 0.01-5 wt. %.

23. The coated cutting tool of claim 19, wherein the polycrystalline $ZrAl_2O_3$ layer has a thickness of 2.5 to 8 μm.

24. The coated cutting tool of claim 19, wherein the coating further comprises one or more base layers between the substrate and the polycrystalline layer of $ZrAl_2O_3$.

25. The coated cutting tool of claim 24, wherein a base layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

26. The coated cutting tool of claim 25, wherein the one or more base layers are selected from the group consisting of TiN, TiCN and TiOCN.

27. The coated cutting tool of claim 19, wherein the coating further comprises one or more outer layers over the polycrystalline $TiZrAl_2O_3$ layer.

28. The coated cutting tool of claim 27, wherein an outer layer comprises one or more metallic elements selected from the group consisting of aluminum and metallic elements of Groups IVB, VB and VIB of the Periodic Table and one or more non-metallic elements of Groups IIIA, IVA, VA and VIA of the Periodic Table.

29. The coated cutting tool of claim 27, wherein the coating is post-coat blasted with ceramic or inorganic particles.

30. The coated cutting tool of claim 27, wherein the coating is polished.

31. The coated cutting tool of claim 19, wherein the polycrystalline $ZrAl_2O_3$ layer is deposited by thermal CVD.

32. The coated cutting tool of claim 19, wherein the substrate comprises cemented tungsten carbide or polycrystalline cubic boron nitride.

33. The coated cutting tool of claim 19, wherein the substrate is an insert, drill bit or saw blade.

34. The coated cutting tool of claim 19, wherein the coating exhibits a critical load ($L_c$) of 60 to 90 N according to ASTM C1624-05—Standard Test for Adhesion by Quantitative Single Point Scratch Testing.

* * * * *